United States Patent
Kim

(10) Patent No.: US 7,989,350 B2
(45) Date of Patent: Aug. 2, 2011

(54) METHOD FOR FABRICATING SEMICONDUCTOR DEVICE WITH RECESS GATE

(75) Inventor: Tae-Hyoung Kim, Ichon-shi (KR)

(73) Assignee: Hynix Semiconductor Inc., Ichon-shi, Kyoungki-do (KR)

( * ) Notice: Subject to any disclaimer, the term of this patent is extended or adjusted under 35 U.S.C. 154(b) by 653 days.

(21) Appl. No.: 11/769,465

(22) Filed: Jun. 27, 2007

(65) Prior Publication Data

US 2008/0160769 A1    Jul. 3, 2008

(30) Foreign Application Priority Data

Dec. 27, 2006  (KR) .................. 10-2006-0134296

(51) Int. Cl.
    *H01L 21/00* (2006.01)
(52) U.S. Cl. .................. 438/706; 438/701; 438/589
(58) Field of Classification Search .................. 438/706, 438/701, 589
    See application file for complete search history.

(56) References Cited

U.S. PATENT DOCUMENTS

| | | | | |
|---|---|---|---|---|
| 5,780,338 A * | 7/1998 | Jeng et al. | ...... | 438/253 |
| 6,475,888 B1 * | 11/2002 | Sohn | ...... | 438/535 |
| 6,613,682 B1 * | 9/2003 | Jain et al. | ...... | 438/706 |
| 6,790,770 B2 * | 9/2004 | Chen et al. | ...... | 438/637 |
| 6,878,646 B1 * | 4/2005 | Tsai et al. | ...... | 438/756 |
| 7,037,850 B2 * | 5/2006 | Lee et al. | ...... | 438/725 |
| 7,151,040 B2 * | 12/2006 | Tran et al. | ...... | 438/401 |
| 7,442,648 B2 * | 10/2008 | Kim et al. | ...... | 438/706 |
| 7,485,557 B2 * | 2/2009 | Han et al. | ...... | 438/589 |
| 7,563,688 B2 * | 7/2009 | Sun et al. | ...... | 438/396 |
| 7,629,242 B2 * | 12/2009 | Han et al. | ...... | 438/589 |
| 7,749,912 B2 * | 7/2010 | Kim et al. | ...... | 438/701 |
| 2002/0160592 A1 * | 10/2002 | Sohn | ...... | 438/535 |
| 2004/0072446 A1 * | 4/2004 | Liu et al. | ...... | 438/719 |
| 2004/0198065 A1 * | 10/2004 | Lee et al. | ...... | 438/725 |
| 2006/0079093 A1 * | 4/2006 | Kim et al. | ...... | 438/706 |
| 2007/0099384 A1 * | 5/2007 | Han et al. | ...... | 438/270 |
| 2007/0123014 A1 * | 5/2007 | Han et al. | ...... | 438/585 |
| 2007/0202657 A1 * | 8/2007 | Sun et al. | ...... | 438/396 |
| 2008/0081447 A1 * | 4/2008 | Jang et al. | ...... | 438/589 |
| 2008/0160769 A1 * | 7/2008 | Kim | ...... | 438/703 |
| 2009/0263972 A1 * | 10/2009 | Balseanu et al. | ...... | 438/696 |

FOREIGN PATENT DOCUMENTS

| | | |
|---|---|---|
| KR | 1020050106878 | 11/2005 |
| KR | 1020060113830 | 11/2006 |
| KR | 1020060114447 | 11/2006 |

OTHER PUBLICATIONS

Notice of Allowance for Korean Application 10-2006-0134296.

* cited by examiner

*Primary Examiner* — Laura M Menz
(74) *Attorney, Agent, or Firm* — Lowe Hauptman Ham & Berner LLP

(57) ABSTRACT

A method for fabricating a semiconductor device includes forming a structure including a sacrificial layer and a hard mask over a substrate, performing a plasma treatment over the structure including the hard mask to form a protective layer over the hard mask, etching the sacrificial layer using the protective layer as an etch barrier, and etching the substrate using the protective layer and the patterned sacrificial layer as an etch barrier to form a recess pattern.

19 Claims, 6 Drawing Sheets

US 7,989,350 B2

1

METHOD FOR FABRICATING SEMICONDUCTOR DEVICE WITH RECESS GATE

CROSS-REFERENCE TO RELATED APPLICATIONS

The present invention claims priority of Korean patent application number 10-2006-0134296, filed on Dec. 27, 2006, which is incorporated by reference in its entirety.

BACKGROUND OF THE INVENTION

The present invention relates to a method for fabricating a semiconductor device, and more particularly, to a method for fabricating a semiconductor device with a recess gate.

With the ultra-high integration of a semiconductor device, a threshold voltage is lowered and a refresh characteristic is degraded due to the decrease of a channel length of a cell transistor. Therefore, increasing the channel length of the cell transistor is needed. Increasing the channel length is achieved through a recess gate process in which a predetermined portion of an active region of a semiconductor substrate is etched to form a recess gate.

FIGS. 1A to 1E illustrate sectional views of a typical method for fabricating a semiconductor device with a recess gate. Referring to FIG. 1A, an isolation structure 12 is formed to define an active region of a substrate 11.

A sacrificial oxide layer 13 and a hard mask layer 14 are formed on the substrate 11 in sequence. For example, the hard mask layer 14 is formed in a double-layer structure including a polysilicon layer 14A and a silicon oxynitride (SiON) layer 14B are stacked on the sacrificial oxide layer 13.

A photoresist pattern 16 is formed over the hard mask layer 14 to define a region where a recess pattern will be formed. Between the hard mask layer 14 and the photoresist pattern 16, an anti-reflective coating layer 15 is interposed to prevent the reflection during a photo-exposure.

Referring to FIG. 1B, the SiON layer 14B is etched using the photoresist pattern 16 as an etch mask. Then, the photoresist pattern 16 and the anti-reflective coating layer 15 are removed. Reference numeral 14X represents a first hard mask pattern including the SiON layer pattern 14B1 and the polysilicon layer 14A.

Referring to FIG. 1C, the polysilicon layer 14A is etched using the SiON layer pattern 14B1 as an etch barrier. The etching of the polysilicon layer 14A is performed until the sacrificial oxide layer 13 is exposed. During the etching of the polysilicon layer 14A, a portion of the sacrificial oxide layer 13 may be etched. Reference numeral 14Y represents a second hard mask pattern including the SiON layer pattern 14B1 and a polysilicon layer pattern 14A1.

Referring to FIG. 1D, the SiON layer pattern 14B1, is removed. The exposed sacrificial oxide layer 13A is etched using the polysilicon layer pattern 14A1 as an etch barrier to expose the substrate 11. Reference numeral 13A represents a sacrificial oxide layer pattern.

Referring to FIG. 1E, the exposed substrate 11 is anisotropically etched using the polysilicon layer pattern 14A1 and the sacrificial oxide layer pattern 13A as an etch barrier, thereby forming a recess pattern 100 having a vertical profile. During this process, the polysilicon layer pattern 14A1 may be all removed. Reference numeral 11A represents a patterned substrate.

A gate is formed over the recess pattern 100 formed through the above-described processes to increase the channel length of the cell transistor, which makes it possible to improve device characteristics such as threshold voltage, refresh, etc. However, as recently a space between patterns is reduced with the advance of ultra-high integration of a semiconductor device, the same phenomenon (i.e., the reduction of a space between recess patterns) is likely to occur during forming of a recess pattern. The reduction between the recess patterns may cause the recess patterns to be bridged together. In addition, a height difference between an isolation structure and an active region frequently occurs during the formation of the isolation structure in a typical recess gate process. The height difference may lead to more frequent occasions of the bridge formation between the recess patterns. The bridge formation will be more fully described with reference to FIGS. 2A to 2C below.

FIGS. 2A to 2C illustrate sectional views showing limitations which may occur in fabricating a typical semiconductor device with a recess gate. Referring to FIG. 2A, an isolation structure 22 is formed in a semiconductor substrate 21 to define an active region. As for more detailed description of the formation of the isolation structure 22, a pad oxide layer (not shown) and a pad nitride layer (not shown) are formed in sequence on the semiconductor substrate 21, and patterned into a predetermined structure. An exposed portion of the semiconductor substrate 21 is etched using the patterned pad oxide and nitride layers as a mask to form trenches. An insulating layer is formed on the entire surface of the above resultant substrate structure, and polished using the patterned pad nitride layer as a polish stop layer to form the isolation structure 22 that fills the trenches. The pad nitride layer is generally removed. Therefore, the active region of the semiconductor substrate 21 is located lower than the isolation structure 22, resulting in the height difference therebetween over the resultant substrate structure.

A sacrificial oxide layer 23 and a polysilicon layer 24 for use in a hard mask are sequentially formed on the above resultant substrate structure having the height difference between the active region of the semiconductor substrate 21 and the isolation structure 22. Due to the height difference, a portion of the polysilicon layer 24 disposed over the active region also becomes lower than a portion thereof disposed over the isolation structure 22.

Referring to FIG. 2B, the polysilicon layer 24 is etched to form a patterned polysilicon layer 24A. At this time, the portion of the polysilicon layer 24 (see FIG. 2A) over the active region is more actively etched than the portion of the polysilicon layer over the isolation structure 22. Consequently, as illustrated in FIG. 2B, a portion of the patterned polysilicon layer 24A over the active region has a weaker structure than the portion of the patterned polysilicon layer 24A over the isolation structure 22.

Accordingly, as illustrated in FIG. 2C, the sacrificial oxide layer 23 and the semiconductor substrate 21 are etched using the patterned polysilicon layer 24A as an etch barrier to form a recess pattern 200. Reference numeral 23A and 21A represent a patterned sacrificial oxide layer and a patterned substrate, respectively. As reference numeral 24B indicates, the portion of the patterned polysilicon layer 24A disposed over the active region is highly likely to be removed during the etching for forming the recess pattern 20 due to the aforementioned structural weakness. For this reason, the patterned polysilicon layer 24A may not act as an effective hard mask (i.e., etch barrier). Therefore, recesses of the recess pattern 200 are likely to be bridged together. Alternatively, it may be difficult to adjust a critical dimension (CD) or a profile of the recess pattern 200.

SUMMARY OF THE INVENTION

Embodiments of the present invention are directed toward providing a method for fabricating a semiconductor device with a recess gate that can prevent a damage of a hard mask during an etching of forming a recess pattern by forming a protective layer over a hard mask through a plasma treatment applied over a substrate where the hard mask is formed, so as to further prevent a bridge formation in the recess pattern, easily adjust a critical dimension and a profile of the recess pattern, and reduce fabrication cost and process time without requiring an additional apparatus.

In accordance with an aspect of the present invention, there is provided a method for fabricating a semiconductor device. The method includes forming a structure including a sacrificial layer and a hard mask over a substrate, performing a plasma treatment over the structure including the hard mask to form a protective layer over the hard mask, etching the sacrificial layer using the protective layer as an etch barrier, and etching the substrate using the protective layer and the patterned sacrificial layer as an etch barrier to form a recess pattern.

DESCRIPTION OF SPECIFIC EMBODIMENTS

Figure 1A:
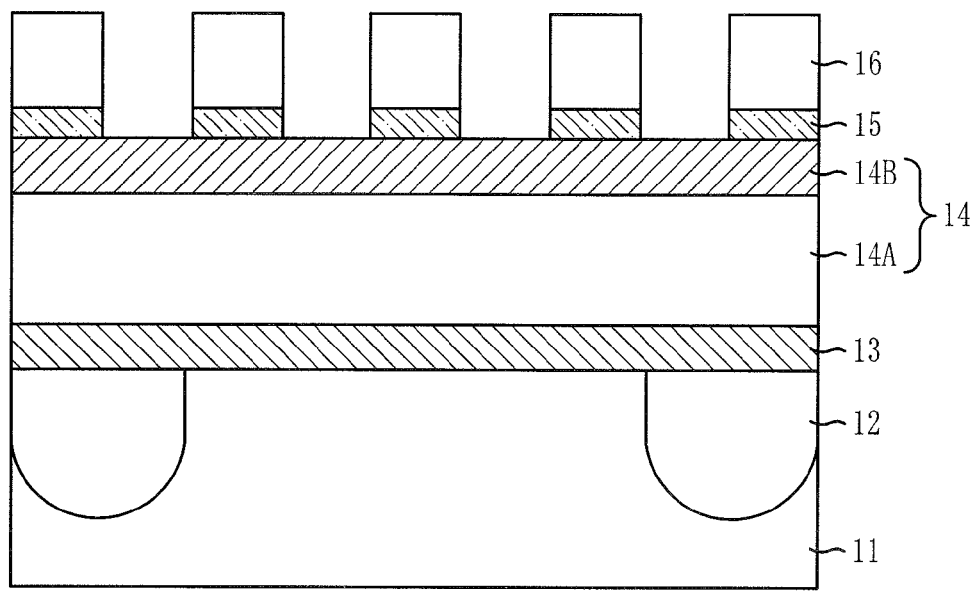
FIGS. 1A to 1E are sectional views illustrating a typical method for fabricating a semiconductor device with a recess gate.
Figure 1B:
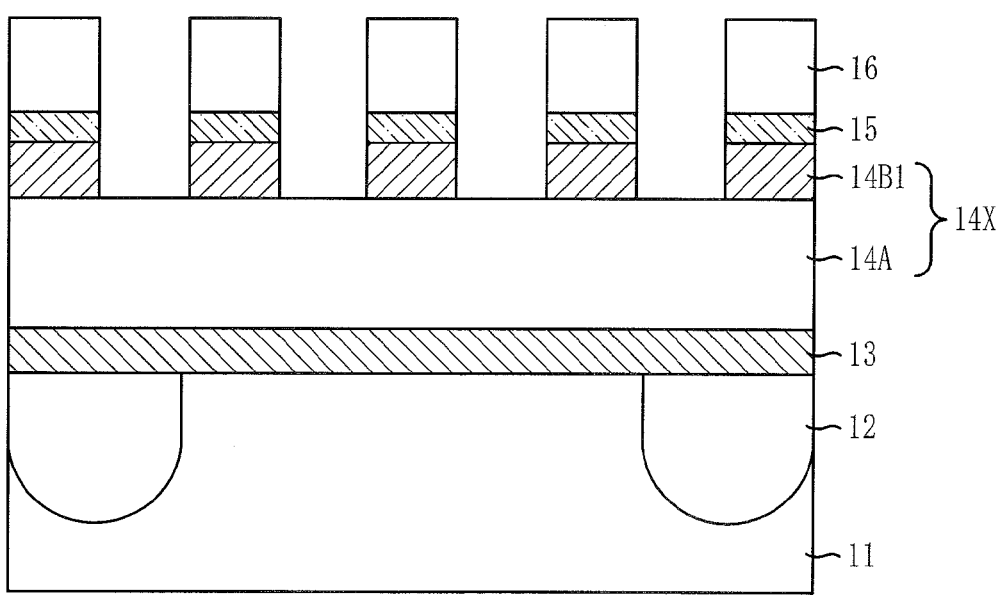
Figure 1C:
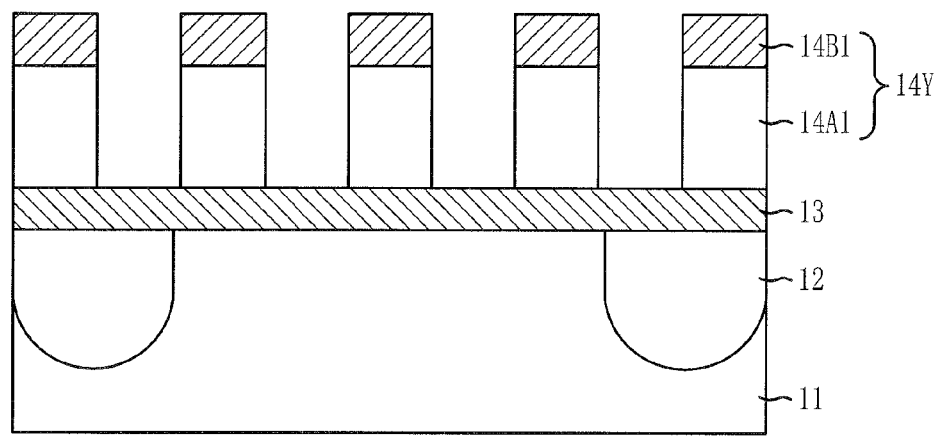
Figure 1D:
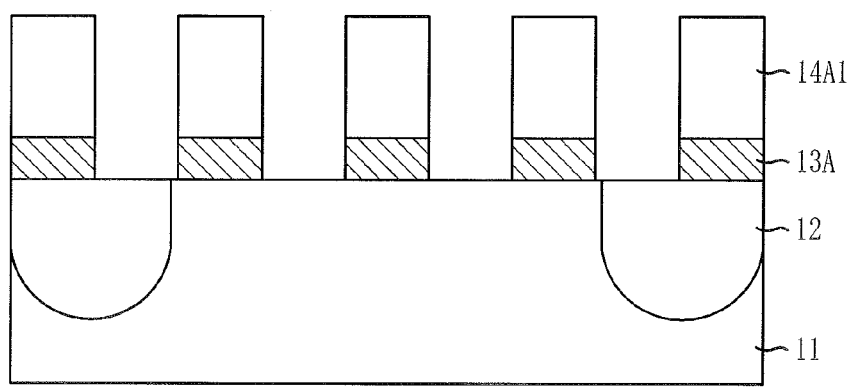
Figure 1E:
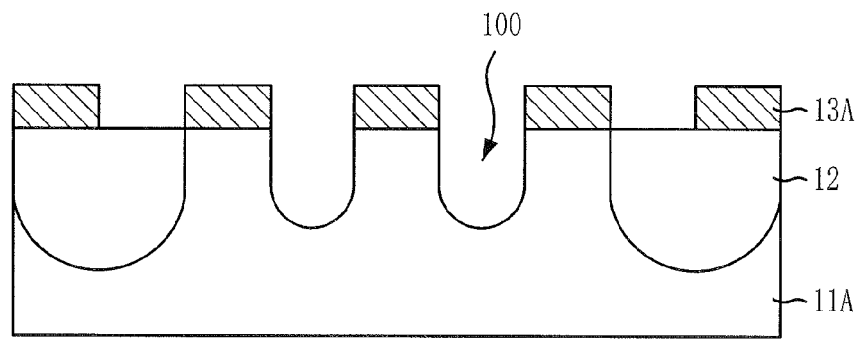
Figure 2A:
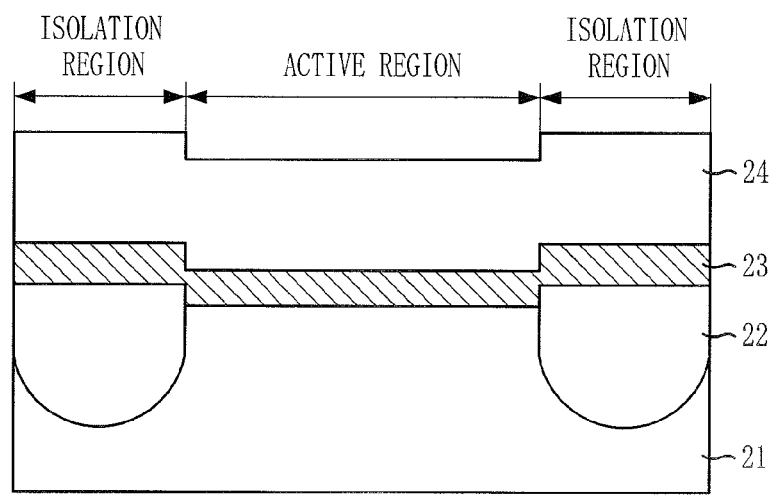
FIGS. 2A to 2C illustrate sectional views showing limitations which may occur in fabricating a typical semiconductor device with a recess gate.
Figure 2B:
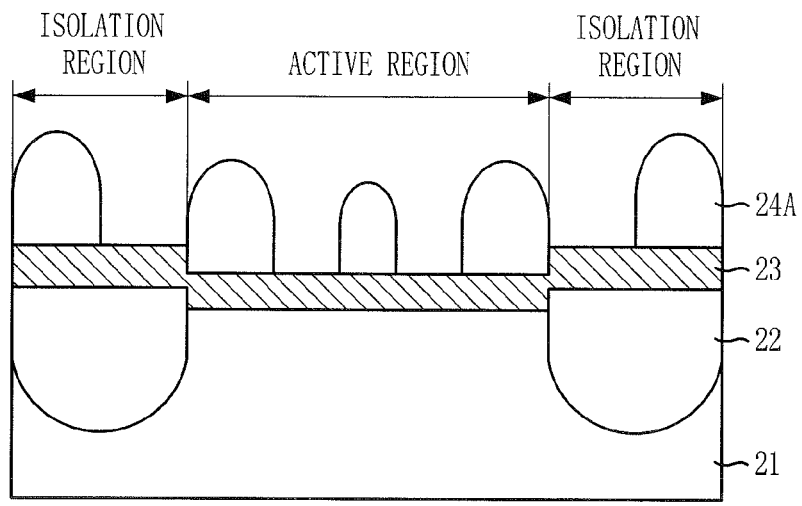
Figure 2C:
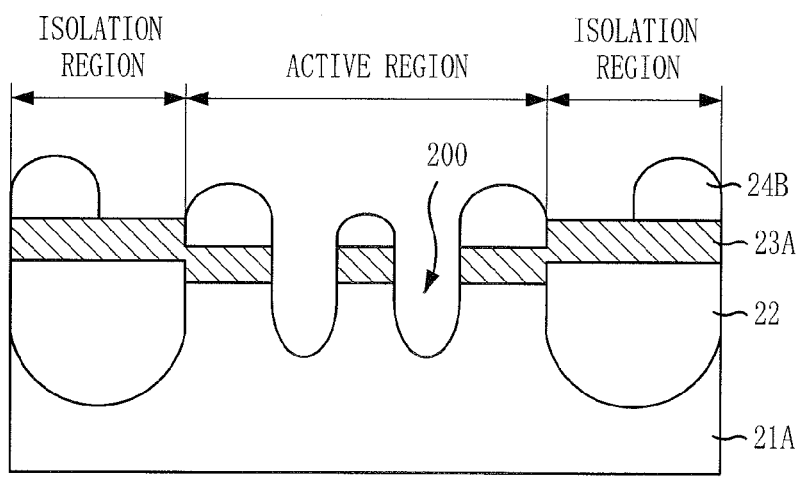
Figure 3A:
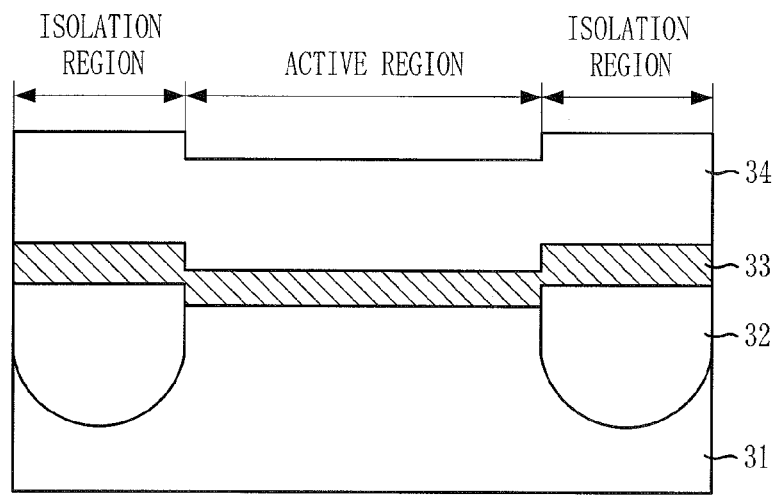
FIGS. 3A to 3C are sectional views illustrating a method for fabricating a semiconductor device with a recess gate in accordance with an embodiment of the present invention.
Figure 3B:
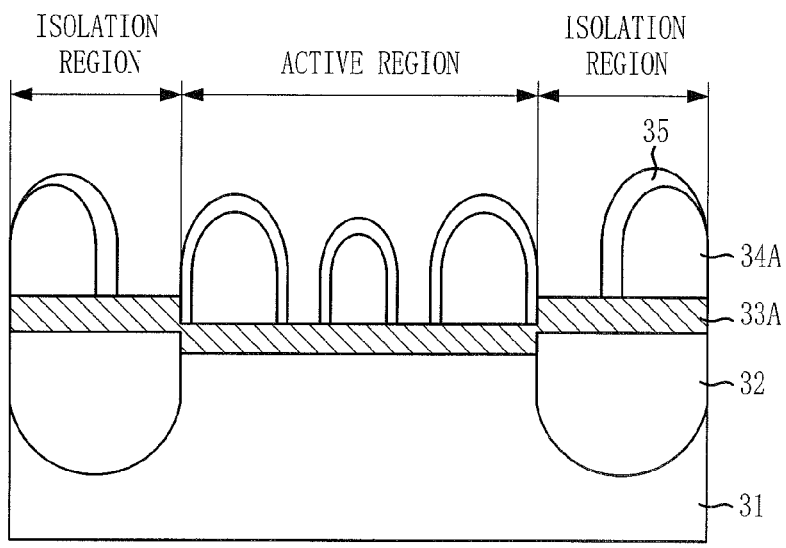
Figure 3C:
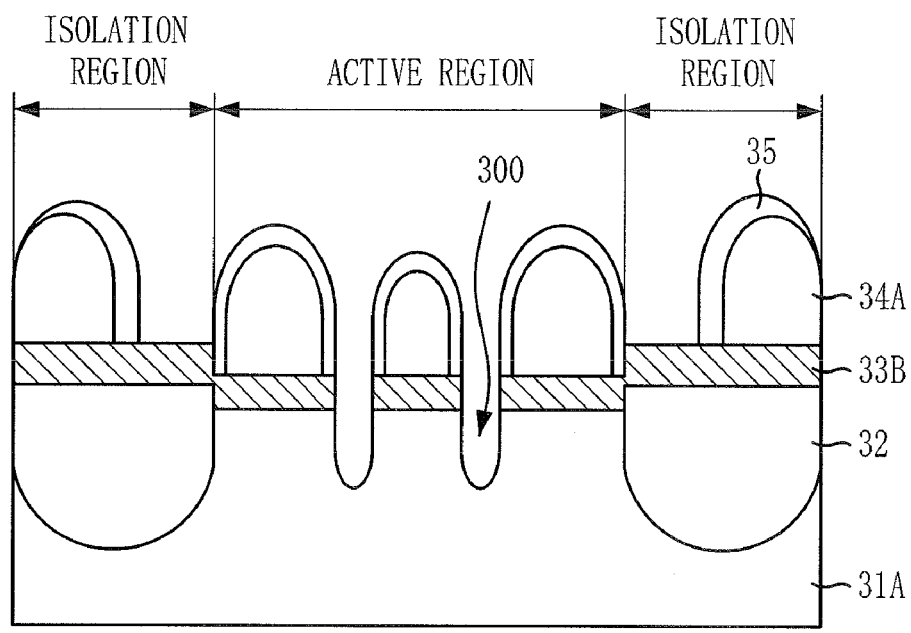

FIGS. 3A to 3C are sectional views illustrating a method for fabricating a semiconductor device with a recess gate in accordance with an embodiment of the present invention.

Referring to FIG. 3A, an isolation structure 32 is formed to define an active region in a substrate 31 (e.g., semiconductor substrate). More specifically, although not shown, a pad oxide layer and a pad nitride layer are sequentially formed over the substrate 31. The pad oxide layer and the pad nitride layer are patterned into a predetermined structure to expose a portion of the substrate 31. The exposed substrate 31 is etched using these patterned pad oxide and nitride layers to form trenches for isolation. An insulating layer is formed over the substrate 31 including the trenches, and polished using the patterned pad nitride layer as a polish stop layer to form an isolation structure 32 that fills the trenches. The patterned pad nitride layer used as the polish stop layer is generally removed. After the formation of the isolation structure 32, the active region of the substrate 31 is lower than the isolation structure 32, resulting in a height difference therebetween.

A sacrificial oxide layer 33 is formed over the resultant structure including the substrate 31 and the isolation structure 32. The sacrificial oxide layer 33 may be the pad oxide layer used in forming the isolation structure 32 or may be another oxide layer which is formed again after removing both the pad nitride layer and the pad oxide layer. The sacrificial oxide layer 33 may be formed to a thickness of, for example, approximately 330 Å.

A hard mask layer 34, which will serve as an etch barrier in a subsequent process of forming a recess pattern, is formed over the sacrificial oxide layer 33. In the present embodiment, the hard mask layer 34 includes polysilicon. The hard mask layer 34 is formed to a thickness of, for example, approximately 800 Å.

Due to the height difference, a portion of the hard mask layer 34 over the active region of the substrate 31 is lower than a portion of the hard mask layer 34 disposed over the isolation structure 32. Although not shown, a photoresist pattern is formed over the hard mask layer 34 to define a region where a recess pattern will be formed.

Referring to FIG. 3B, the hard mask layer 34 is etched using the photoresist pattern as an etch mask. The etching of the hard mask layer 34 is performed until the sacrificial oxide layer 33 is exposed. To completely expose the sacrificial oxide layer 33, an over-etching can be performed so that a portion of the sacrificial oxide layer 33 is etched. For instance, the sacrificial oxide layer 33 is partially etched such that a first patterned sacrificial oxide layer 33A has a thickness ranging from approximately 30 Å to approximately 100 Å. Reference numeral 34A represents a hard mask.

As mentioned above, since the portion of the hard mask layer 34 over the active region is lower than the portion thereof over the isolation region, the etching of the hard mask layer 34 over the active region is more actively performed during the etching of the hard mask layer 34. Thus, a hard mask 34A over the active region has a weaker structure than that over the isolation region. In this case, since it is often difficult for a hard mask 34A over the active region to act as an effective etch barrier during a subsequent etch process for forming a recess pattern, a plasma treatment is performed over the resultant structure including the hard mask 34A to form a protective layer 35 over a surface of the hard mask 34A. The protective layer 35 protects the hard mask 34A during the subsequent etching.

Since the plasma treatment is performed in-situ in the same apparatus where the etching of the hard mask layer 34 is performed, changing the apparatus for the plasma treatment is unnecessary. As a result, it is possible to reduce fabrication cost and total process time. The plasma treatment is performed using a gas mixture including $O_2$ and $N_2$ gases. The protective layer 35, which is an oxide layer, covers the hard mask 34A but not the first patterned sacrificial oxide layer 33A because of the absence of a silicon source. The protective layer 35 is formed to a thickness ranging from approximately 30 Å to approximately 100 Å.

Referring to FIG. 3C, the first patterned sacrificial oxide layer 33A is etched using the protective layer 35 as an etch barrier to expose the substrate 31. The first patterned sacrificial oxide layer 33A is anisotropically etched. For instance, the etching of the first patterned sacrificial oxide layer 33A proceeds with using $CF_4$ gas at a flow rate ranging from approximately 20 sccm to approximately 100 sccm. Although the protective layer 35 is also etched with the first patterned sacrificial oxide layer 33A, the protective layer 35 formed on sidewalls of the hard mask 34A is less etched due to the characteristic of the anisotropic etching itself. Thus, the protective layer 35 can serve as an etch barrier during a subsequent process of forming a recess pattern.

The exposed substrate 31 is anisotropically etched using the protective layer 35 and the first patterned sacrificial oxide layer 33A as an etch barrier to form a recess pattern 300 having a substantially vertical profile. Reference numeral 31A represents a patterned substrate after this anisotropic etching. Since the protective layer 35 remains on the sidewalls of the hard mask 34A, acting as an etch barrier, it is possible to prevent an occurrence of bridged recesses in the recess pattern, and adjust a critical dimension and a profile of the recess pattern 300. The etching for forming the recess pattern 300 is performed using an etch gas, which has a higher etch selectivity to an oxide layer than to a silicon layer. Reference numeral 33B represents a second patterned sacrificial oxide layer. For instance, an etch selectivity ratio of the oxide layer to the silicon layer is approximately 3:1 or higher. For this etch selectivity ratio, the etching proceeds with using a gas mixture including HBr and $Cl_2$ gases, wherein the HBr gas flows at a rate ranging from approximately 90 sccm to 150 sccm, and the $Cl_2$ gas flows at a rate ranging from approximately 30 sccm to 50 sccm.

Although not shown, as a subsequent process, a cleaning process may be performed over the above resultant structure to remove the protective layer 35, the second patterned sacrificial oxide layer 33B, and other etching by-products. The cleaning process is performed by a wet cleaning process using a mixed solution including deionized water (DI water) and HF. For instance, the wet cleaning process is performed for approximately 30 seconds to 45 seconds, wherein a mixing ratio of the DI water to HF ranges between approximately 15:1 and approximately 25:1. A recess gate is formed over the recess pattern 300.

In accordance with various embodiments of the present invention, a plasma treatment is performed over the resultant substrate structure including the hard mask to form a protective layer over the hard mask. Accordingly, it is possible to prevent damage on the hard mask during the etching for forming the recess pattern. This effect disallows formation of bridges in the recess pattern. In addition, it is easy to adjust the critical dimension and the profile of the recess pattern. Further, an additional apparatus is not required, thereby reducing fabrication cost and process time.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, the method comprising:
    forming a sacrificial layer over a substrate;
    forming a hard mask layer over the sacrificial layer;
    forming a hard mask having sidewalls by etching the hard mask layer;
    forming a protective layer over the hard mask to cover the sidewalls of the hard mask through oxidizing a surface of the hard mask by performing a plasma treatment over a structure including the sacrificial layer and the hard mask, the plasma treatment and the etching of the hard mask layer being performed in-situ in a same apparatus;
    forming a patterned sacrificial layer by etching the sacrificial layer using the protective layer as an etch barrier; and
    forming a recess pattern by etching the substrate using the protective layer and the patterned sacrificial layer as an etch barrier.

2. The method of claim 1, wherein the forming of the hard mask, comprises:
    forming a photoresist pattern defining a recess pattern region over the hard mask layer; and
    etching the hard mask layer using the photoresist pattern as an etch mask.

3. The method of claim 1, wherein the hard mask comprises polysilicon.

4. The method of claim 1, wherein the etching of the hard mask layer proceeds until the sacrificial layer remains with a thickness ranging from approximately 30 Å to approximately 100 Å.

5. The method of claim 3, wherein the performing of the plasma treatment comprises using a gas mixture including $O_2$ and $N_2$ gases.

6. The method of claim 5, wherein the protective layer is formed to a thickness ranging from approximately 30 Å to approximately 100 Å.

7. The method of claim 1, wherein the etching of the sacrificial layer comprises performing an anisotropic etching.

8. The method of claim 7, wherein the etching of the sacrificial layer comprises using $CF_4$ gas with a flow rate ranging from approximately 20 sccm to 100 sccm.

9. The method of claim 1, wherein the forming of the recess pattern comprises using an etch gas having a high etch selectivity ratio of the sacrificial layer to a silicon-based layer, the forming of the sacrificial layer comprising forming an insulation material, and the forming of the insulation material comprising forming an oxide-based material.

10. The method of claim 9, wherein the high etch selectivity ratio is approximately 3:1 or higher.

11. The method of claim 9, wherein the etch gas includes HBr and $Cl_2$ gases.

12. The method of claim 11, wherein the HBr gas flows at a rate in a range from approximately 90 sccm to 150 sccm, and the $Cl_2$ gas flows at a rate in a range from approximately 30 sccm to 50 sccm.

13. The method of claim 1, further comprising, after the forming of the recess pattern, cleaning a resultant structure obtained after forming the recess pattern.

14. The method of claim 13, wherein the cleaning of the resultant structure comprises performing a wet cleaning using a mixture including deionized water and HF.

15. The method of claim 14, wherein a ratio between the deionized water and the HF ranges between approximately 15:1 and approximately 25:1.

16. The method of claim 14, wherein the cleaning of the resultant structure proceeds for approximately 30 seconds to 45 seconds.

17. The method of claim 13, further comprising, after the cleaning of the resultant structure, forming a gate filling the recess pattern while protruding over the substrate.

18. The method of claim 1, further comprising, before the forming of the sacrificial layer, forming an isolation structure in the substrate to define an active region.

19. The method of claim 1, wherein the hard mask is entirely surrounded by the protective layer and the sacrificial layer, after forming the protective layer.

* * * * *